United States Patent
Perndl et al.

(10) Patent No.: US 9,939,473 B2
(45) Date of Patent: Apr. 10, 2018

(54) POWER METER WITH TWO DETECTOR ELEMENTS FOR A POWER MEASUREMENT EVEN OF EXTREMELY LOW FREQUENCIES

(71) Applicant: Rohde & Schwarz GmbH & Co. KG, Munich (DE)

(72) Inventors: Werner Perndl, Zorneding (DE); Alexander Kunze, Munich (DE); Burkhard Kuefner, Schleching (DE); Thomas Reichel, Lichtenau (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 233 days.

(21) Appl. No.: 14/823,169

(22) Filed: Aug. 11, 2015

(65) Prior Publication Data

US 2016/0047849 A1 Feb. 18, 2016

(30) Foreign Application Priority Data

Aug. 12, 2014 (DE) .............................. 102014215924
Mar. 2, 2015 (DE) .............................. 102015203649

(51) Int. Cl.
G01R 1/30 (2006.01)
G01R 21/133 (2006.01)
G01R 19/10 (2006.01)

(52) U.S. Cl.
CPC ............ *G01R 21/133* (2013.01); *G01R 19/10* (2013.01)

(58) Field of Classification Search
CPC ........ G01R 17/16; G01R 23/09; G01R 31/333; H03F 1/04
See application file for complete search history.

(56) References Cited

U.S. PATENT DOCUMENTS 5,786,895 A * 7/1998 Mitchell .............. G01C 19/667
356/467
2011/0238341 A1 * 9/2011 Etezadi-Amoli ...... B01D 53/02
702/61

FOREIGN PATENT DOCUMENTS

DE 19913338 9/2000
DE 102006024699 11/2007

* cited by examiner

*Primary Examiner* — Tung X Nguyen
(74) *Attorney, Agent, or Firm* — Lee & Hayes, PLLC (57) ABSTRACT

The invention relates to a power meter with a two-path or multipath detector comprising at least two detector elements. Each detector element generates an output voltage. In order to detect an electrical power of an alternating electrical input signal, the sum and the difference of the output voltages of the detector elements are formed separately from one another.

14 Claims, 8 Drawing Sheets

Fig. 1

(Prior Art)

Fig. 2

(Prior Art)

POWER METER WITH TWO DETECTOR ELEMENTS FOR A POWER MEASUREMENT EVEN OF EXTREMELY LOW FREQUENCIES

PRIORITY

This application claims priority of German patent applications DE 10 2014 215 924.5 filed on Aug. 12, 2014 and DE 10 2015 203 649.9 filed on Mar. 2, 2015, which are incorporated by reference herewith.

FIELD OF THE INVENTION

The invention relates to an extension of the frequency range of a power meter to the DC voltage in order to measure the power of high-frequency or respectively microwave signals.

BACKGROUND OF THE INVENTION

Within a power meter, a power detector, for example, is used. The measurement value derived from an applied alternating signal—the measurement signal—is obtained either from the heat resulting from absorption or by squaring the signal voltage and subsequent averaging. In general, the measurement signal is an electrical voltage or an electrical current; however, in principle, it could also be any other physical parameter.

In the case of the diode-based power sensors, a squaring of the signal voltage is achieved on the basis of the nonlinear characteristic of the diode, which, in the case of small levels, provides a linear dependence of the output voltage on the input power: see, for example, published patent application DE 199 13 338 A1. On the one hand, the detector element should comprise a good dynamic behaviour which is achieved with a relatively low time constant $\tau$. In this context, the time constant is the product of the zero-point resistance $R0$ of the diode and the capacitance $C$ of the charging capacitor of the detector element. On the other hand, this detector element should provide a low lower cut-off frequency, in order to detect even very low-frequency input signals. This cut-off frequency is also formed from the zero-point resistance $R0$ and the capacitance of the charging capacitor. Because of this linking, a small-time constant $\tau$ achieves a high cut-off frequency and vice versa. For example, the cut-off frequency of a detector element for time constants $\tau$ between 10 nanoseconds up to 1 microsecond is disposed at 10 megahertz to 500 megahertz. With frequencies below the cut-off frequency, an increasingly negative measurement deviation occurs, or respectively, in the case of its correction, a loss of sensitivity, which, in the case of a DC voltage, is 100%. The detector element accordingly has a high-pass behaviour, which makes the detection of electrical powers of low-frequency signals impossible.

In order to make power measurements with signals with a frequency from 9 kilohertz, as is frequently required in the case of EMV applications, a very large time constant $\tau$ within the range from 500 microseconds must be taken into account. With such large time constants $\tau$, time variations of the envelope power cannot be measured because of the very low video bandwidth of 300 Hertz. In the case of a measurement of the mean power value, relatively long waiting times must be waited after a relatively large power variation or overdriving of a measurement path. This disadvantageously leads to a lengthening of measurement times.

One object of the invention among other is therefore to provide a power meter which, on the one hand, achieves a very good dynamic performance and can therefore react to strongly or respectively rapidly changing envelope powers of the input signal without long prolongations of measurement time, and, on the other hand, achieves a low lower cut-off frequency in order to detect the power of low-frequency signals.

SUMMARY OF THE INVENTION

According to one aspect of the invention, a power meter with a multipath detector, especially a two-path detector, comprising at least two detector elements is provided. Each of the detector elements generates an output voltage. In order to calculate an electrical power of an alternating electrical input signal, the sum and the difference of the output voltages of the detector elements are formed separately from one another in the power meter. The common-mode component of the output voltages of the detector elements is detected by forming the sum; the differential-mode component is detected by forming the difference. In this context, the differential-mode component is detected substantially at frequencies higher than the cut-off frequency of the detector element, whereas the common-mode component is detected substantially at a frequency lower than the cut-off frequency—down to a DC input signal.

Other configurations of the detector elements, for example, with the Graetz circuit or alternative bridge rectifier, or in the context of a multipath detector, are not excluded from the idea of the invention.

The invention therefore achieves the object in that the measurement deviations, which a detector element provides with small electrical time constants in the case of low cut-off frequencies determined in the manner of a high-pass, are compensated by an alternating voltage measurement of the common-mode component running parallel in time. In this context, a specific property of high-frequency detector elements is exploited according to the invention. This property consists in the fact that the common-mode component superposed on the output signal of the power detector is just so large that its power corresponds precisely to the power deficit in the measurement result of the detector element.

The output signal of the power detector contains frequency components which can be suppressed by means of a low-pass filter. The output signal with these components removed corresponds to the envelope power, which is the power over one period of the high-frequency signal. The envelope power is proportional to the square of the envelope of the signal voltage.

One underlying measurement principle according to the invention among others applies independently of the level of the signal frequency applied to the power meter, that is, also at an arbitrary distance below or above a cut-off frequency of the detector elements. Accordingly, a floating transition from a low-frequency measurement process to a high-frequency measurement process is achieved.

For large frequencies by comparison with the cut-off frequency, the voltages in the charging capacitors are in antiphase. In this case, the differential-mode component is the measure for the power at the input.

For very low frequencies by comparison with the cut-off frequency, the input voltage is disposed with identical phase in both charging capacitors. The common-mode component is the measure for the power.

At frequencies within the range of the cut-off frequency, both the common-mode component and also the differential-mode component are relevant for the power at the input.

The power deficit to be corrected can be obtained in a simple manner by squaring the common-mode component in the output signal. For this purpose, the output signal is picked up at the respective charging capacitor. Because of a negligible impedance of the capacitor at relatively high frequencies, a correction is necessary only at relatively low frequencies, so that a restriction with regard to noise, lower power-measurement threshold and accuracy is not expected.

In order to calculate the electrical power from the alternating electrical input signal, a digital calculation unit can be provided. By preference, the digital calculation unit comprises a combining unit, wherein the combining unit combines the common-mode component and the differential-mode component in order to obtain the electrical power. This combination allows a compensation of the error which occurs at low frequencies in the power detector.

By preference, the digital calculation unit comprises a squaring unit, wherein the squaring unit is connected upstream of the combining unit. The squaring by means of this squaring unit is independent of the squaring of the alternating signal by the detector elements. The common-mode component in a power component is converted in the squaring unit, and in the case of a combination with the differential-mode component proportional to the power, the power deficit occurring because of the detector elements is compensated.

In a preferred embodiment, the digital calculation unit comprises a power-value unit. The power-value unit is connected upstream of the combining unit. With the power-value unit, the proportionality between the power and the measurement signal detected as a voltage at the output of the detector elements is linked in a numerically correct manner.

By preference, the digital calculation unit comprises an integrator, wherein the integrator is connected downstream of the combining unit. Mean values can be formed by integration of the envelope power present upstream of the integrator. An important mean value is the floating mean value formed over an adequately long period, and this is designated as the mean power value. The integrator unit additionally has the task of determining the envelope power of this component from the momentary power of the common-mode component.

In order to determine the absolute level of the signal to power from the measurement signal, a scaling factor can be generally required. In the ideal case, this factor is independent of the frequency of the alternating signal and the ambient temperature. By preference, a scaling unit is therefore connected downstream of the integrator.

In a preferred embodiment, the common-mode component is delivered to the combining unit via a first signal path. Furthermore, the differential-mode component is delivered to the combining unit via a second signal path different from the first signal path. Accordingly, the formation of the sum and the difference takes place upstream of the digitisation by means of an analog circuit arrangement, so that the calculation effort in the digital calculation unit is significantly reduced and, in particular, a high-frequency sampling by means of analog-digital converter can be avoided. The demands on the digital calculation unit are accordingly reduced.

By preference, the digital calculation unit comprises a first analog-digital converter, which digitises the common-mode component delivered via the first signal path. Furthermore, the digital calculation unit comprises a second analog-digital converter, which digitises the differential-mode component delivered via the second signal path. The separate digitisation of common-mode and differential-mode component allows a simple combination of both values in the digital calculation unit.

In a preferred embodiment, a differential amplifier which delivers the differential-mode component as an output voltage is arranged in the second signal path. Furthermore, a differential amplifier which delivers the common-mode component as an output voltage is arranged in the first signal path. In particular, the differential amplifiers are formed by operational amplifiers, so that the sum and the difference can be determined in a very simple manner.

An amplifier is advantageously introduced between the detector element and the digital calculation unit in the first signal path and also in the second signal path in order to decouple the power detector from the calculation unit.

In an alternative embodiment, the digital calculation unit comprises a first analog-digital converter and a second analog-digital converter, wherein the common-mode component is generated by addition of the output signal of the first analog-digital converter and the output of the second analog-digital converter. Accordingly, the formation of the common-mode component takes place on the digital plane through simple digital operations.

In a further preferred embodiment, the differential-mode component is generated by subtraction of the output signal of the first analog-digital converter and the output signal of the second analog-digital converter.

Furthermore, a power meter comprising at least two detector elements can be provided according to the invention. Each detector element comprises a charging capacitor and generates an output voltage. For the to calculation of an electrical power of an alternating electrical input signal, the capacitances of the charging capacitors are varied dependent upon the frequency of the alternating electrical input signal, for example, by connecting further capacitors.

This embodiment according to another aspect of the invention has the advantage that, through the frequency-dependent embodiment of the charging capacitors, the cut-off frequency of the detector elements is displaced in order to detect the power of low frequencies.

BRIEF DESCRIPTION OF THE DRAWINGS

In the following, the invention is explained in greater detail on the basis of exemplary embodiments by way of example only. In this context, various elements may have been presented in an oversimplified manner. Identical reference numbers refer to identical components of the invention. The drawings show.

DETAILED DESCRIPTION OF PREFERRED EMBODIMENTS

Figure 1:
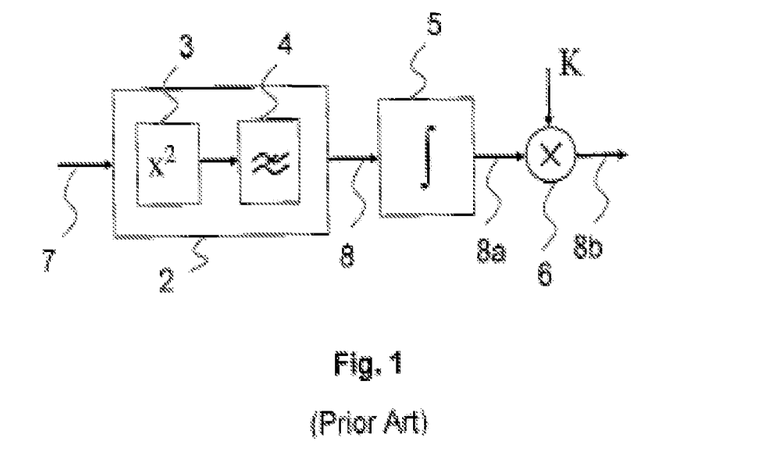
FIG. 1 a functional circuit diagram of an ideal power meter according to the prior art.

FIG. 1 shows a simplified functional circuit diagram of an ideal power sensor according to the current internal status in the applicant's laboratory. An ideal power meter absorbs and measures the power p supplied as a whole to a measurement input. The supplied power p is the power sum of all partial signals, that is, for example, the sum of the measurement signal 7, its harmonic and the superposed broadband noise, from all spectral lines of the input signal respectively.

The measurement signal 7 is generally an electrical voltage u or an electrical current i or—as is conventional in high-frequency technology and microwave technology—a wave. In the power meter 1, a power detector 2 is used to detect the supplied power p. All measurement principles for the detection of the electrical power p can be represented mathematically by a squaring 3 of the applied alternating signal 7. The output signal of the squaring unit 3 is a value proportional to the momentary electrical power of the alternating signal 7 and contains various frequency components. The higher frequency components in the case of the doubled signal frequency of the applied alternating signal 7 and the sum of two frequencies of the frequency mixture are not required for the calculation of the electrical power. They contain redundant information and are therefore suppressed by a low-pass filter 4. The output signal of the power detector 2 with these components removed corresponds to the envelope power 8. The envelope power 8 is the power p over one period of the high-frequency signal 7. The envelope power 8 is proportional to the square of the envelope of the applied signal voltage or respectively signal current 7.

Mean values 8*a*, 8*b*, which are more significant for many applications than the envelope power 8, can be formed through an integration of the envelope power 8 by means of an integrator 5. The most conventional mean value is the mean power value 8 formed from a sufficiently long time constant $\tau$. In the case of signals 7 with a pronounced time structure, for example, a signal burst or a time-multiplex signal, abbreviated as a TDMA signal, a power measurement at signal-synchronous ports is preferred. To determine the absolute level of the signal power 8*b* from the applied measurement signal 7, a scaling factor K which takes into consideration the sensitivity of the power detector 2 is generally required. For this purpose, a scaling unit 6 is provided in the image according to FIG. 1.

Figure 2:
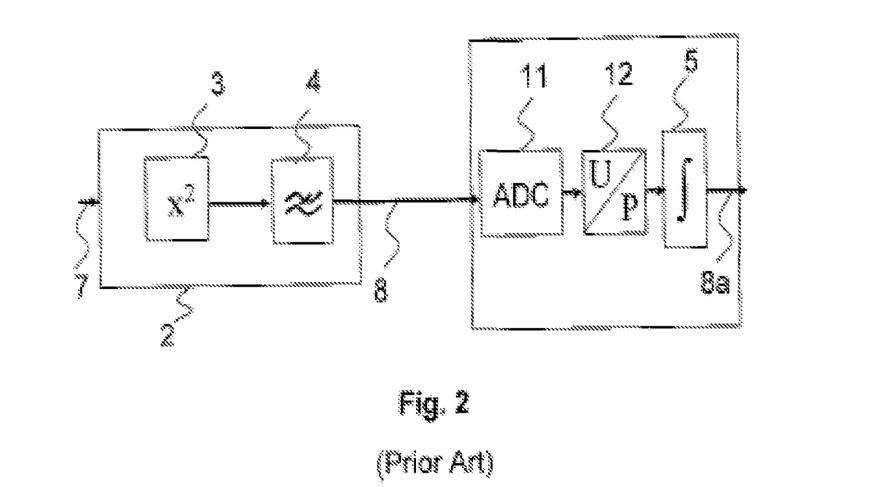
FIG. 2 a simplified block-circuit diagram of a power meter according to the prior art.

FIG. 2 shows a simplified block-circuit diagram of a power meter according to the previous internal status in the applicant's laboratory. In this context, a key function is provided by the high-frequency power detector 2 in the absorption and accurate power evaluation of the high-frequency measurement value 7. Accordingly, the low-pass filter 4 filters frequency components out of the measurement value, which deliver a power magnitude redundant to the electrical power p to be detected. Once again, the envelope power 8 of the applied alternating signal value 7 can be picked up at the output of the low-pass filter 4.

For the calculation of the mean power value 8*a*, a digital signal processing is provided according to FIG. 2. Initially, an analog-digital conversion of the envelope power signal 8 is implemented with digital signal processing by means of an analog-digital converter 11, abbreviated as an ADC. A power-value unit 12 is provided at the output of the ADC 11.

In this context, FIG. 2 presents a simplified power meter. In particular, alternative measurement paths, trigger control, chopping unit and acquisition-controlled double sampling, abbreviated as ACDS, are not presented.

Figure 3:
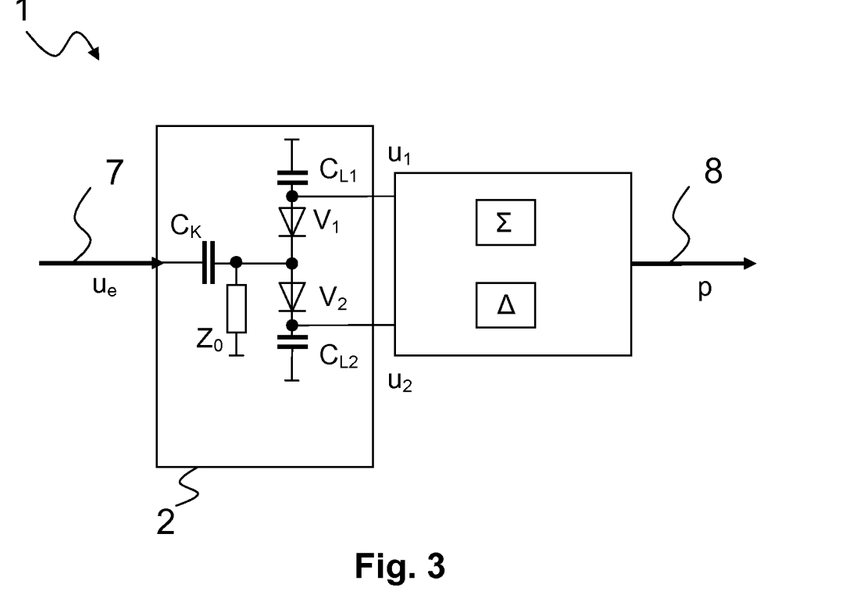
FIG. 3 a first exemplary embodiment of a power meter according to the invention in a schematic circuit diagram.

FIG. 3 shows a first exemplary embodiment of the present invention. The detector elements formed by means of detector diodes V1, V2 and charging capacitors $C_{L1}$, $C_{L2}$ show a linear dependence of the differential output voltage over the power of the input signal for low levels, for example, smaller than −20 dBm. This means that the output voltage is proportional to the square of the high-frequency input amplitude. The power detector 2 therefore corresponds to the squaring unit 3 and to the low-pass filter 4, as shown in FIG. 1 and FIG. 2. This power detector 2 generates from the input signal 7 two modulated or un-modulated output voltages $u_1$ and $u_2$. On the one hand, the detected voltages u1 and u2 are summated in the power meter 1 and, on the other hand, they are also subtracted. The sum $\Sigma$—the common-mode component—and the difference $\Delta$—the differential-mode component—of the voltages u1 and u2 form the basis for the electrical power p to be detected, because now, both the common-mode component and also the differential-mode component of the voltages u1, u2 detectable in the power detector 2 are observed. In order to decouple the power detector 2 from other upstream circuit modules, a coupling capacitor $C_k$ is provided in the exemplary embodiment, which can also be omitted.

High-frequency signals are rectified in the detector and mapped onto the differential-mode component. Low-frequency voltages at the input of the detector reappear at the output as a common-mode component. By taking the common-mode component into consideration in the power calculation, a compensation of the measurement error occurring especially in the case of low frequencies of the measurement value 7 is achieved, so that the actual power p, for example, an envelope power 8, a mean power value 8*a* etc. of the applied input signal 7, is obtained.

The mathematical context is explained in greater detail with reference to FIG. 4. The context is explained here with applied electrical voltages u.

Figure 4:
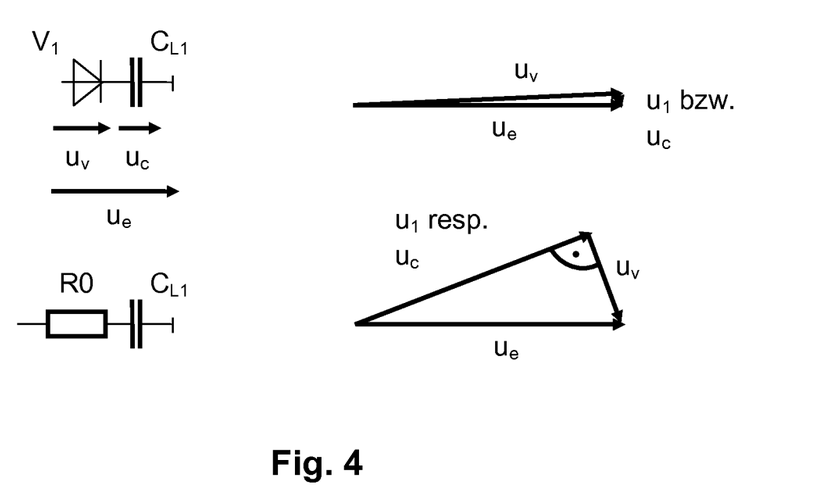
FIG. 4 an equivalent circuit diagram and two phasor diagrams of a detector element.

FIG. 4 shows one of the two detector elements V1 comprising a series circuit of a detector diode and a charging capacitor CL1. The input voltage $u_e$ in this context is made up from the vectorial sum of the diode voltage $u_v$ and the charging-capacitor voltage $u_{c11}$ together. The voltage components resulting from the rectification, especially the DC voltage and AC voltage components of the doubled signal frequency are not shown. Since a rectifier diode as a detector element V1 acts approximately like a linear resistor R0 in the quadratic region of its characteristic, the two phasor diagrams according to FIG. 4 apply. The detector time constant $\tau$ is equal to the product of the zero-point resistance of the diode R0 and the capacitance of the charging capacitor CL1.

The upper phasor diagram of FIG. 4 applies for high-frequency input voltages $u_e$, wherein the voltage drop in the detector diode $u_v$ is significantly larger here than, for example, in the lower phasor diagram. Ignoring the AC voltage component which declines at the capacitor CL1, therefore leads to very small errors for high frequencies relative to the cut-off frequency of the alternative high-pass filter.

Furthermore, the lower phasor diagram in FIG. 4 applies for an input voltage $u_e$ of which the frequency is disposed within the region of the cut-off frequency of the alternative high-pass filter, at which the full input voltage $u_e$ in the charging capacitor CL1 no longer declines because of the now strongly fallen impedance value $X_c$ of the charging capacitors CL1. Ignoring this voltage component $u_v$ would lead to considerable measurement errors and is avoided according to the invention.

According to the invention, the following mathematical relationship is exploited for this purpose. Regardless of the frequency f of the input voltage $u_e$, the vectorial sum of $u_v$ and $u_1$ is always $u_e$. For both phasor diagrams, Pythagoras' theorem therefore applies for the input voltage $u_e$ because of the orthogonality of $u_c$ (or respectively $u_1$) relative to $u_v$:

$$|u_e|^2 = |u_{CL}|^2 + |u_v|^2.$$

With regard to the reference impedance $Z_0$, the following therefore applies for the power p:

$$p = \frac{|u_e|^2}{z_0} - \frac{|u_c|^2}{z_0} + \frac{|u_v|^2}{z_0}$$

wherein, according to the existing prior art, the voltage drop is ignored and, in the charging capacitor $C_{L1}$, the following:

$$p \approx \frac{|u_v|^2}{z_0} \triangleq \overline{u_1}$$

has been taken as the mean power value for the applied input voltage $u_e$.

For very high frequencies of the measurement value 7, the impedances $X_c$ of the charging capacitors CL1, CL2 of the power detector 2 are very low by comparison with the linear equivalent resistance R0 of the diodes V1, V2, so that ignoring this AC voltage component of the voltages u1,u2 of the power detector 2 in such cases causes a negligible error. According to the prior art, it has been assumed for high-frequency measurement values 7, that the differential voltage picked up in the charging capacitors CL1,CL2 corresponds to the input power.

However, for very low frequencies of the measurement value 7, almost the entire input voltage $u_e$ is present in phase in the charging capacitor CL1,CL2. Accordingly, the common-mode component must not be ignored for the power calculation.

The common-mode component is therefore determined according to the invention by summation of the voltages u1, u2, and the differential-mode component is determined by difference formation of the voltages u1, u2 and taken into consideration for the power calculation in the power meter 1.

The following FIGS. 5 to 11 show alternative embodiments of the power meter 1 according to the invention as shown in FIG. 3 for forming the sum u1+u2 and of the difference u1−u2. In the descriptions of the individual Figs., reference will be made only to the differences.

Figure 5:
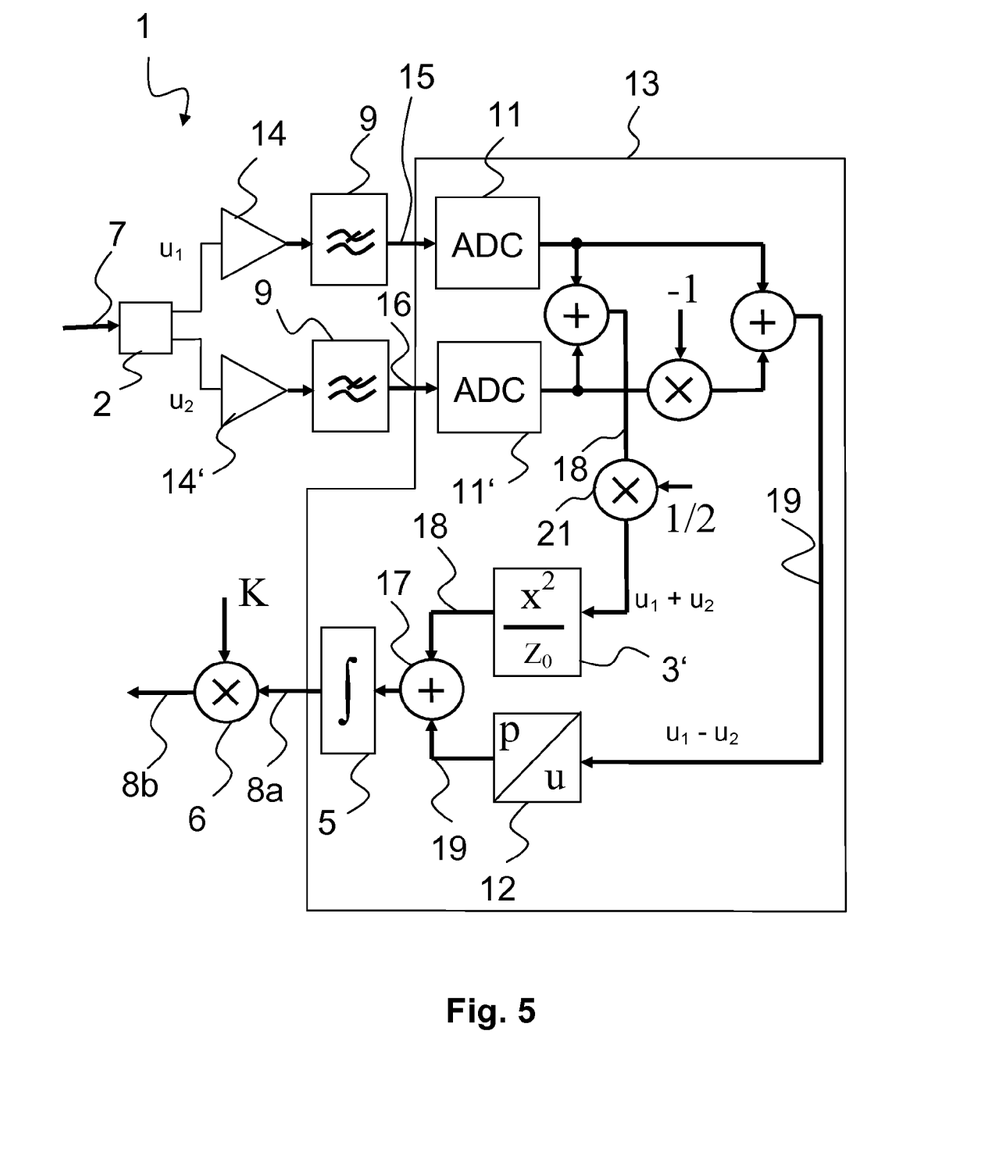
FIG. 5 a detailed block-circuit diagram of the first exemplary embodiment of the power meter shown in FIG. 3.

FIG. 5 shows in greater detail the block diagram illustrated in FIG. 3 for a first exemplary embodiment of the power meter 1 according to the invention. According to FIG. 5, the input signal 7 is first applied to the power detector 2 already shown in FIG. 3, wherein the signal voltages u1,u2 of the power detector 2 are used according to the invention for a sum formation u1+u2 and a difference formation u1−u2 implemented separately and in parallel.

According to FIG. 5, an amplification or attenuation and digitisation of the signal voltage u1 of the power detector 2 is first implemented in a first signal path 15. In parallel and separately to this, an amplification or attenuation and digitisation of the signal voltage u2 of the power detector 2 is implemented in a second signal path 16. In the first signal path 15 and in the second signal path 16, an amplifier 14 and an anti-aliasing filter 19 are provided for this purpose in each case. The to amplifiers 14, 14' are embodied in particular as impedance converters in order to exclude an impedance loading of the power detector 2 and a resulting falsification of the signals u1,u2 by a digital calculation unit 13 connected downstream.

The digital calculation unit 13 now forms both the sum u1+u2 and also the difference u1−u2 of the supplied signals u1 and u2. For this purpose, an analog-digital converter 11 is provided for each signal path 15, 16 in order to digitise the voltage values u1,u2.

The output of the first analog-digital converter 11 is now added to the output of the second analog-digital converter 11' and supplied on a summation path 18 of the power meter 12 to a squaring unit 3'. Accordingly, the common-mode component of the voltages u1 and u2 is guided along the summation path 18. Through formation of the sum u1+u2 of the voltages u1 and u2, the common-mode component of the voltage falling at the power detector 2 in the impedance $X_c$, of the charging capacitors CL1,CL2 is also taken into consideration for the power calculation.

This common-mode component is converted into a power value in a squaring unit 3'. The squaring unit 3' is different from the squaring unit 3' in FIG. 1 or FIG. 2 and respectively from the squaring by the detector elements V1, V2. A numerical correction of the resulting power value p is implemented by dividing the resulting power value by the reference impedance $Z_0$ in the squaring unit 3' and, furthermore, also through the correction unit 21, which matches the common-mode component in the summation path 18 by means of the correction ½ factor to the differential signal u1−u2.

In a parallel and separate second signal path 16, the output signal of the analog-digital converter 11 is added to the negated output signal of the analog-digital converter 11', which is equivalent to a subtraction of the two voltages u1 and u2. Through the difference formation of the voltages u1 and u2, the differential-mode component of the output voltage u1,u2 can also be determined in parallel to the common-mode component. The differential-mode component is supplied to a power-value unit 12 via a subtraction path 19. Within the framework of this correction, an equivalent input power P is allocated to the voltage values U, wherein influences of ambient temperature, carrier frequency and the level of the input power relative to the linearity transmission characteristic of the detector elements V1, V2 are corrected.

The power component of the summation path 18 is combined with the power component of the subtraction path 19 by means of a combining unit 17. In this manner, the power deficit of the detector elements V1, V2 in the determination of the power 8a of the electrical measurement value 7 is compensated, especially in the case of low frequencies.

An integrator 5 is connected downstream of the combining unit 17 in order to obtain the mean power value 8*a*. The integrator 5, which is required in a classical power meter only in order to reduce the noise bandwidth and for the mean-value formation, is also used according to the invention to remove the signal components of the doubled frequency of the measurement value 7 from the power result obtained.

A scaling unit 6, which takes into consideration the sensitivity of the power detector 2, is connected downstream of the integrator 5. In the ideal case, the scaling factor K is independent of frequency and ambient temperature.

In principle, according to FIG. 5, the voltages u1,u2 of the detector elements V1, V2 are amplified and digitised in two separate and mutually fully symmetrical signal paths 15, 16. In the digital calculation unit 13, especially a digital signal processor DSP, the common-mode and the differential-mode component are formed by addition and respectively subtraction, and the common-mode component is squared.

Figure 6:
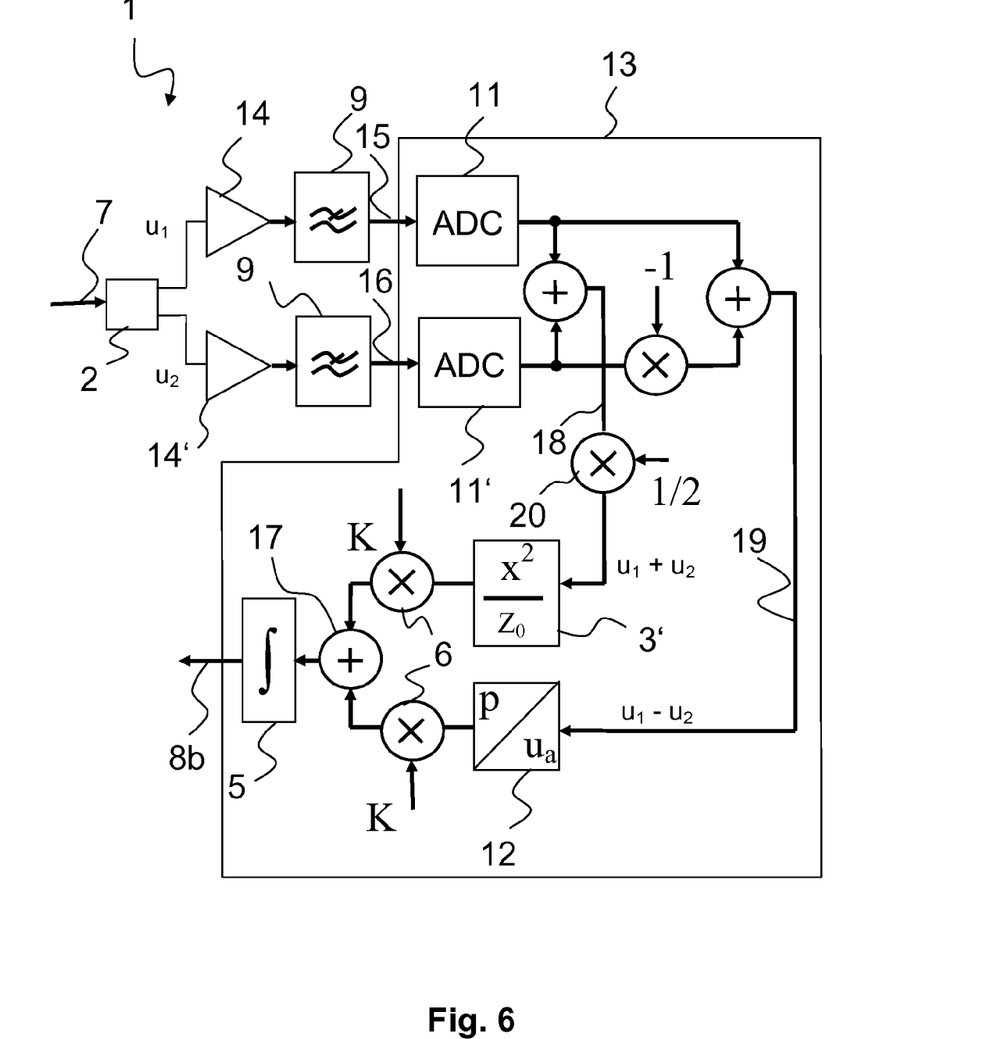
FIG. 6 an alternative embodiment to FIG. 5 of the power meter according to the invention.

FIG. 6 shows an alternative embodiment to FIG. 5 of the first exemplary embodiment according to the invention of a power meter 1. By way of difference from FIG. 5, the scaling unit 6 in FIG. 6 is connected upstream of the combining unit 17. This has the advantage that correction factors for the two signal paths can be determined and used individually. In this context, the respective scaling factors K can also be different, so that a scaling with a scaling factor K1 can be connected downstream of the squaring unit 3', and a scaling with a scaling factor K2 can be connected downstream of the power-value unit 12.

Figure 7:
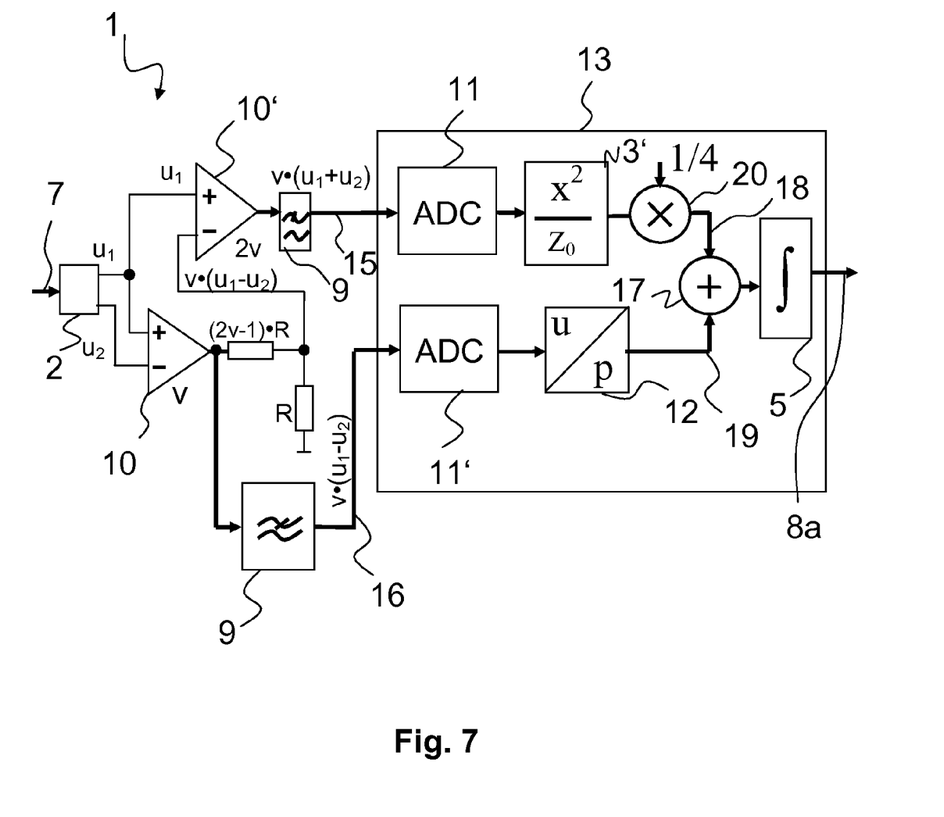
FIG. 7 an alternative embodiment to FIG. 5 and FIG. 6 of the power meter according to the invention.

FIG. 7 shows an alternative exemplary embodiment to FIG. 5 or FIG. 6 of the power meter 1 according to the invention. By contrast with FIG. 5 or FIG. 6, the sum formation u1+u2 of the voltages u1, u2, and the difference formation u1−u2 of the voltages u1, u2 is implemented in an analog circuit arrangement and especially upstream of the digitisation by a digital calculation unit 13. The sum u1+u2 and the difference u1−u2 are delivered to the digital calculation unit 13 on separate signal paths 15, 16.

As shown in FIG. 7, a first differential amplifier 10 and a second differential amplifier 10' are provided. The second differential amplifier 10' comprises an amplification 2·V double the size of the first differential amplifier 10. The second differential amplifier 10' forms the difference u1−u2 of the voltages u1, u2 and delivers these via the second signal path 16 to the second analog-digital converter 11'.

The first differential amplifier 10 forms the sum of the outputs u1, u2 of the power detector 2 in the first signal path 15 and delivers these to the first analog-digital converter 11 of the digital calculation unit 13. For this purpose, the negative input of the differential amplifier 10' is supplied with a voltage V·(u1−u2) applied via a voltage splitter (2V−1)·R to R of the output of the differential amplifier 10, so that a summation voltage V·(u1+u2) is obtained at the output of the second differential amplifier 10' amplifying with double amplification 2·V, which is delivered to the digital calculation unit 13.

In the digital calculation unit 13, the summation voltage v·(u1+u2) and the differential voltage v·(u1−u2) are initially digitised in separate signal paths 15, 16. A squaring unit 3' is introduced in the summation path 18 of the digital calculation unit 13, as in FIG. 5 or 6, in order to convert the voltage v·(u1+u2) into a power value and to scale it to the reference impedance $Z_0$. By way of difference from FIG. 5 or FIG. 6, the correction of the summation voltage u1+u2 in FIG. 7 takes place only after the squaring unit 3', wherein a correction factor of ¼ must now be applied in the correction unit 20 because of the squaring of the summated signal, in order to match the level of the summated signal u1+u2 to the level of the differential voltage u1−u2.

A power-value conversion of the differential voltage V·(u1−u2) takes place in the subtraction path 19 of the digital calculation unit 13 by means of the power-value unit 12, corresponding to FIG. 5 or FIG. 6. The subsequent combination and integration is also implemented correspondingly to FIG. 5 or FIG. 6, so that a mean power value 8*a* can be picked up at the output of the power meter 1, which compensates the power deficit occurring in the detector elements V1, V2. A scaling unit 6 which is not illustrated operates corresponding to FIG. 5 or FIG. 6.

Figure 8A:
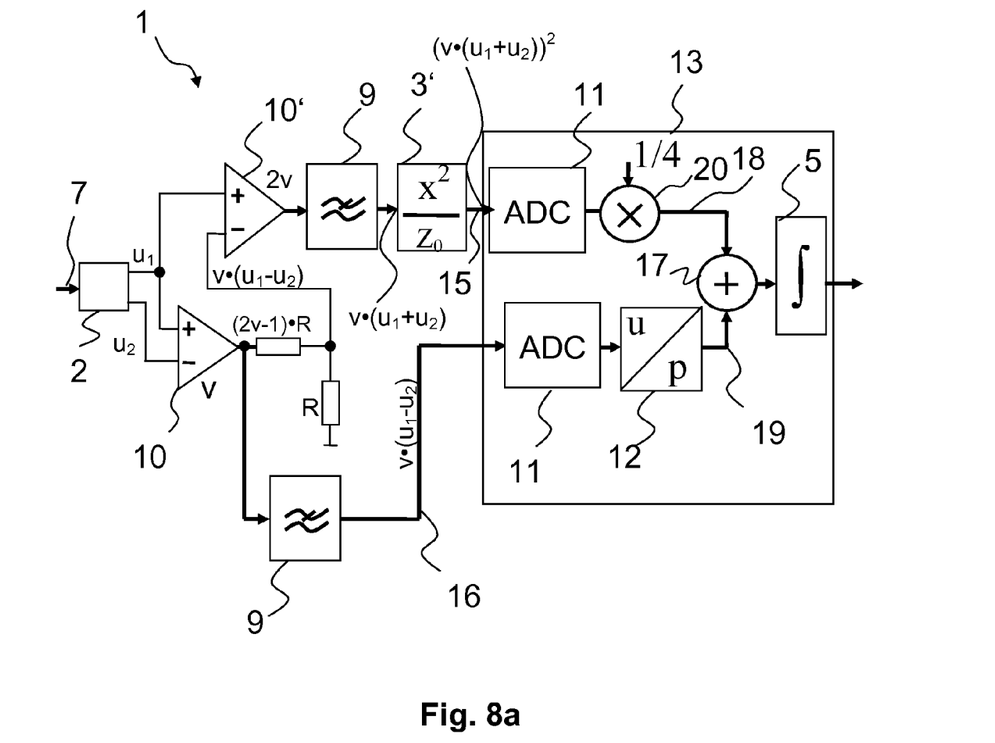
FIG. 8a an alternative embodiment to FIG. 7 of the power meter according to the invention.

FIG. 8*a* shows an alternative exemplary embodiment to FIG. 7 of a power meter 1 according to the invention. In FIG. 8*a*, the formation of the summation voltage V·(u1+u2) and the differential voltage V·(u1−u2) is implemented as in FIG. 7. By way of difference from FIG. 7, the first signal path 15 comprises an analog squaring unit 3' instead of the digital squaring unit 3' shown in FIG. 7.

Figure 8B:
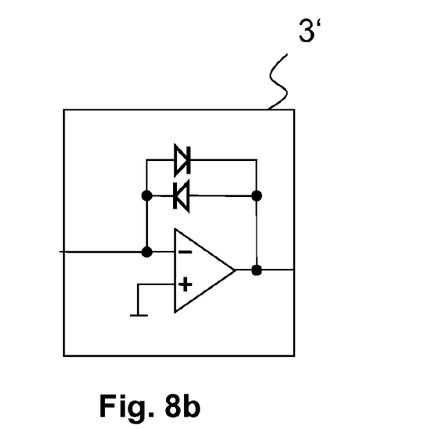
FIG. 8*b* an exemplary embodiment of an analog squaring unit.

FIG. 8*b* shows an exemplary circuit of an analog squaring unit 3'. With the analog squaring unit 3', it is advantageously possible for the first analog-digital converter 11 to be operated with a substantially lower sampling rate, because the first ADC 11 must only be able to detect the fluctuation in the envelope curve in order to fulfil the Nyquist criterion and not the oscillation itself. The significant reduction in sampling rate leads to a significantly simplified form of the ADC 11 and significantly reduces the manufacturing costs for the power meter.

Figure 9:
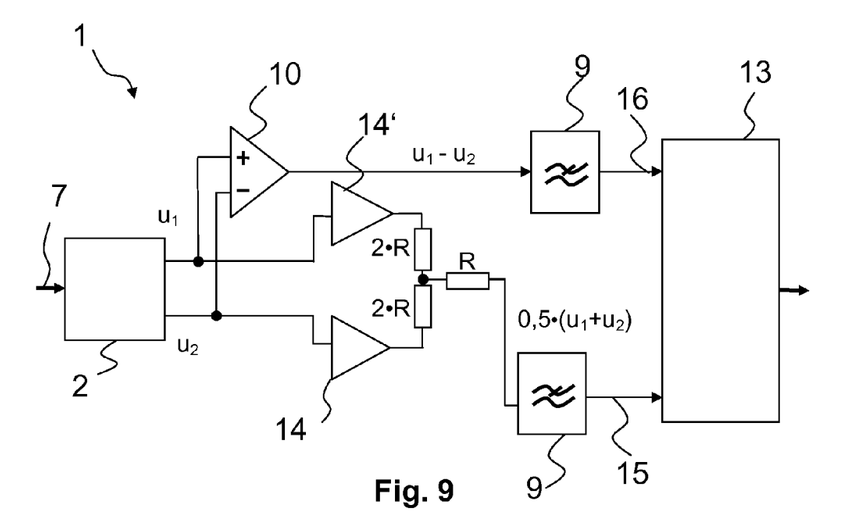
FIG. 9 an alternative embodiment to FIGS. 7 and 8 of the power meter according to the invention.

FIG. 9 shows an alternative exemplary embodiment to FIGS. 7 and 8 of a power meter 1 according to the invention. For the formation of the sum V·(u1+u2), two amplifiers 14, 14' are provided in FIG. 10 in the second signal path 16, wherein the first amplifier 14 is connected at the input end to the voltage u1, and the second amplifier 14' to the voltage u2. The outputs of the amplifiers 14, 14' are connected to a resistance network 2R, R in order to deliver an amplitude-corrected summation voltage 0.5·(u1+u2) to the digital calculation unit 13.

Figure 10:
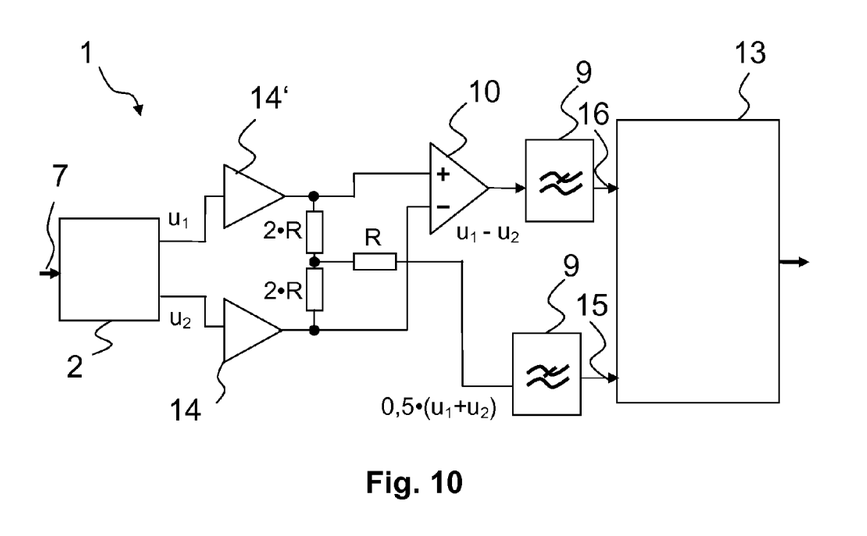
FIG. 10 an alternative embodiment to FIGS. 7 to 9 of a power meter according to the invention.

FIG. 10 shows an alternative embodiment to that of FIG. 9, wherein the resistance network 2R, R provided for the formation of the sum u1+u2 of the voltages u1, u2 is initially impedance-matched by means of an amplifier 14. Furthermore, a differential amplifier 10 provided for the formation of the difference u1−u2 of the voltages u1, u2 is initially impedance-matched by means of an amplifier 14. In this manner, the loading of the power detector 2 by the analog circuit elements R, 10 is avoided.

Figure 11:
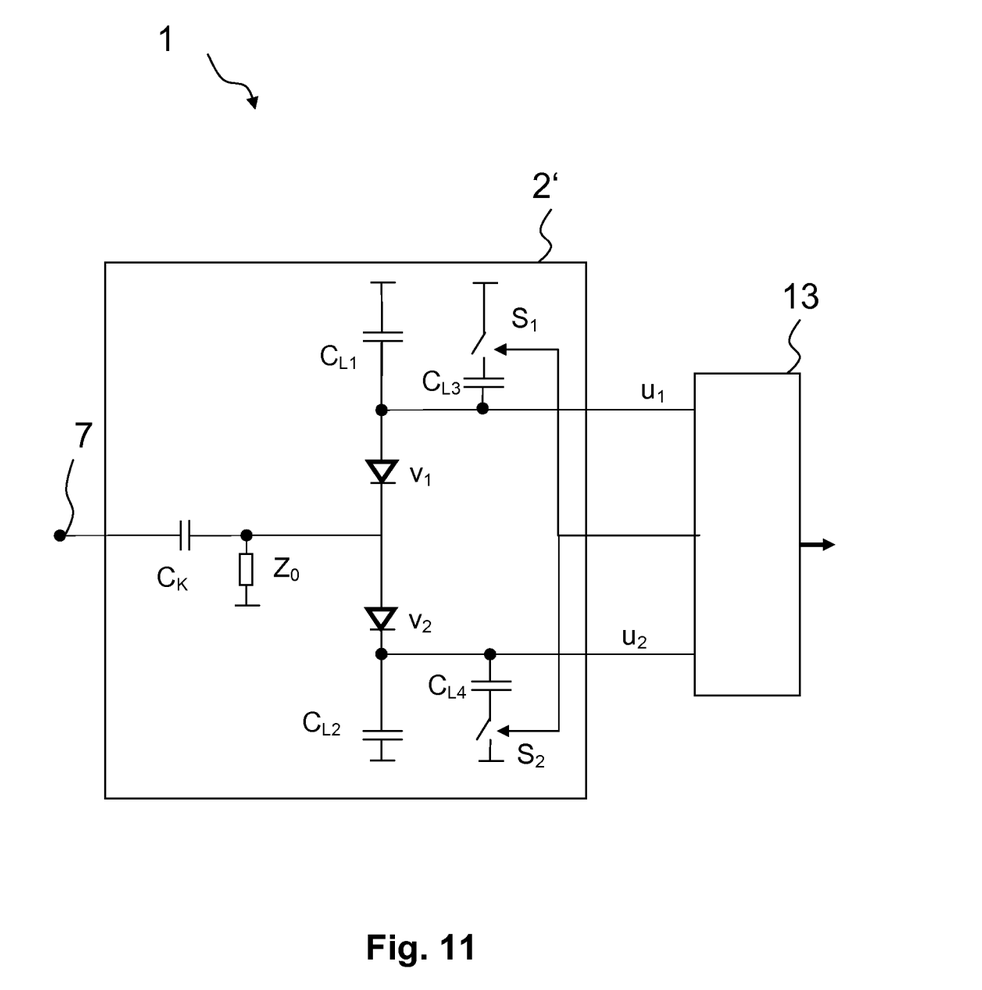
FIG. 11 a second exemplary embodiment of a power meter according to the invention.

FIG. 11 shows a second exemplary embodiment of a power meter 1 according to the invention. By contrast with the preceding power meters 1, the power meter according to FIG. 11 is embodied with an alternative power detector 2'. In this context, an input signal 7 is initially applied to the power detector 2'. Corresponding to FIG. 3, detector elements V1, V2 are provided, which are formed from detector diodes and charging capacitors $C_{L1}$, $C_{L2}$. The power detector 2 accordingly also corresponds to the squaring unit 3 and to the low-pass filter 4 as shown in FIG. 1 and FIG. 2. This power detector 2 generates from the input signal 7 two modulated or unmodulated output voltages $u_1$ and $u_2$. The detected voltages u1 and u2 are supplied to the calculation unit 13 connected downstream.

In order to detect the power of an input signal 7 with a frequency below the cut-off frequency of the detector elements V1, V2, it is now proposed that the charging capacitors $C_{L1}$, $C_{L2}$ are varied in a frequency-dependent manner.

This is implemented by the switches S1, S2, which are opened synchronously whenever the input signal 7 has a frequency above the cut-off frequency. The switches S1, S2 are closed synchronously whenever the input signal 7 has a frequency below the cut-off frequency. Further capacitors $C_{L3}$, $C_{L4}$ are connected to the detector elements V1, V2 by the closing of the switches S1, S2, and accordingly the time constant of the resulting detector elements V1, V2 is enlarged. In this manner, the cut-off frequency falls, and a relatively lower frequency input signal 7 can be processed.

In this context, the switches S1, S2 can be controlled by the same calculation unit 13. Alternatively, the configuration of the switches S1, S2 is implemented by an additional component.

The power meter 2' according to FIG. 11 is illustrated only in a schematic manner. Provision is made for a plurality of further switches S and charging capacitors C to be arranged and to open and respectively to close in each case at different input frequencies in order to influence the time constant of the detector elements V1, V2.

The individual components of the invention can be combined arbitrarily with one another. In particular, components claimed and/or described and/or illustrated can be combined arbitrarily with one another.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A power meter with a multipath detector comprising at least two detector elements,
   wherein each detector element generates an output voltage
   wherein the power meter forms, separately from one another, the sum and the difference of the output voltages of the detector elements in order to detect an electrical power of an alternating electrical input signal, and
   wherein a digital calculation unit is provided within the power meter, wherein the digital calculation unit comprises a combining unit, wherein the combining unit calculates the sum and the difference of the output voltages of the detector elements in order to calculate the electrical power.

2. The power meter according to claim 1,
   wherein each detector element comprises a charging capacitor.

3. The power meter according to claim 1,
   wherein the digital calculation unit comprises a squaring unit, wherein the squaring unit is connected upstream of the combining unit.

4. The power meter according to claim 1,
   wherein the digital calculation unit comprises a scaling unit, wherein the scaling unit is connected upstream or downstream of the combining unit.

5. The power meter according to claim 1,
   wherein the digital calculation unit comprises a power-value unit, wherein the power-value unit is connected upstream of the combining unit.

6. The power meter according to claim 1,
   wherein the digital calculation unit comprises an integrator, and the integrator is connected downstream of the combining unit.

7. The power meter according to claim 1,
   wherein the sum of the output voltages of the detector elements is delivered to the combining unit via a first signal path and
   wherein the difference of the output voltages of the detector elements is delivered to the combining unit via a second signal path different from the first signal path.

8. The power meter according to claim 7,
   wherein the digital calculation unit comprises a first analog-digital converter which digitises the sum delivered via the first signal path, and wherein the digital calculation unit comprises a second analog-digital converter which digitises the difference delivered via the second signal path.

9. The power meter according to claim 7,
   wherein a differential amplifier which delivers the difference as an output voltage is arranged in the second signal path.

10. The power meter according to claim 7,
    wherein a differential amplifier which delivers the sum (as an output voltage is arranged in the first signal path.

11. The power meter according to claim 7,
    wherein an amplifier and/or an attenuator is introduced between the detector element (V1, V2) and the digital calculation unit in the first signal path and/or in the second signal path.

12. The power meter according to claim 1,
    wherein the digital calculation unit comprises a first analog-digital converter and a second analog-digital converter, wherein the sum of the output voltages of the detector elements is generated by addition of the output signal of the first analog-digital converter and the output signal of the second analog-digital converter.

13. The power meter according to claim 12,
    wherein the difference is generated by subtraction of the output signal of the first analog-digital converter and the output signal of the second analog-digital converter.

14. A power meter comprising at least two detector elements and a digital calculation unit,
    wherein each detector element comprises a charging capacitor,
    wherein each detector element generates an output voltage,
    wherein, for the calculation of an electrical power of an alternating electrical input signal, the capacitances of the charging capacitors are varied dependent upon the frequency of the alternating electrical input signal, and
    wherein the digital calculation unit comprises a combining unit, wherein the combining unit calculates the sum and the difference of the output voltages of the detector elements in order to calculate the electrical power.

* * * * *